Figure 1:
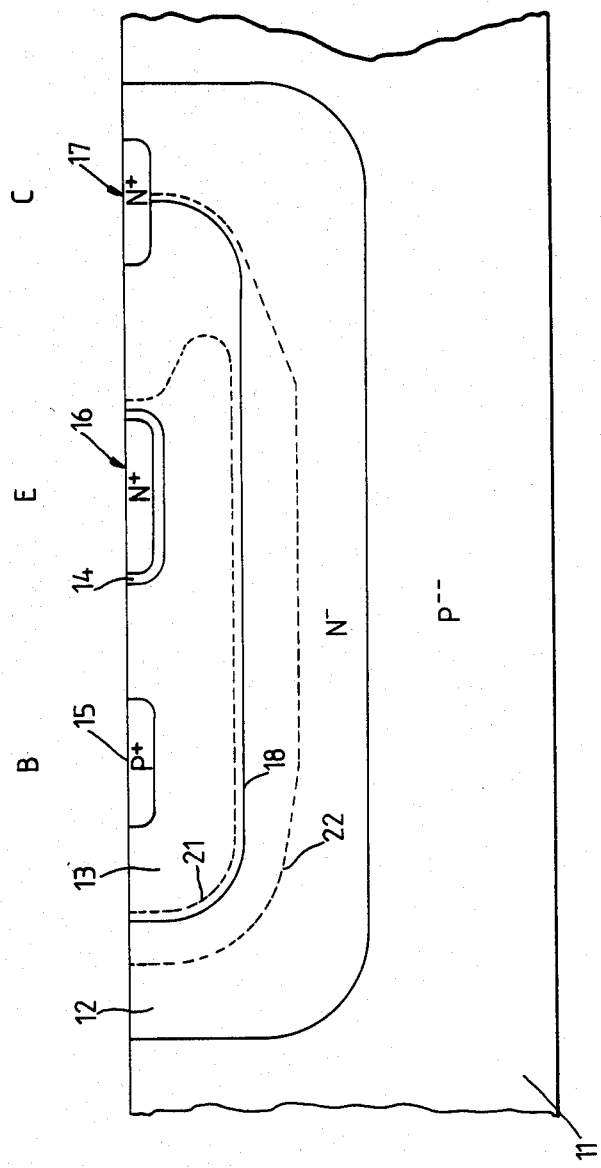

United States Patent [19]
Magee

[11] Patent Number: 4,642,667
[45] Date of Patent: Feb. 10, 1987

[54] INTEGRATED CIRCUITS

[75] Inventor: Terence E. Magee, Fulbourn, England

[73] Assignee: Standard Telephones & Cables, London, England

[21] Appl. No.: 661,819

[22] Filed: Oct. 17, 1984

[30] Foreign Application Priority Data

Oct. 18, 1983 [GB] United Kingdom ............... 8327868

[51] Int. Cl.$^4$ .......................................... H01L 29/72
[52] U.S. Cl. ...................................... 357/35; 357/36; 357/42; 357/43; 357/89
[58] Field of Search .................. 357/35, 36, 43, 89, 357/42

[56] References Cited

U.S. PATENT DOCUMENTS 3,391,035  7/1968  MacKintosh ..................... 357/44
4,292,642  9/1981  Appels et al. ..................... 357/89

FOREIGN PATENT DOCUMENTS 0009442  4/1980  European Pat. Off. ........... 357/92

OTHER PUBLICATIONS

Castrucci et al., "Bipolar/FET High-Performance Circuit," *IBM Tech. Discl. Bull.*, vol. 16, No. 8, Jan. 1974, pp. 2719–2720.

Primary Examiner—Martin H. Edlow
Attorney, Agent, or Firm—Kerkam, Stowell, Kondracki, & Clarke

[57] ABSTRACT

A bipolar lateral transistor is formed in a highly doped $p^-$-type well (13) the base contained in a lightly doped $n^-$-type well (12) the collector in a very lightly doped $p^{--}$-type substrate (11). The arrangement is such that the boundary of the collector/base depletion region is distributed so that the non-depleted base region is wide below the emitter but very narrow at the surface. This defines a narrow active base region in the lateral emitter-collector path thus ensuring that the transistor operates predominantly in its lateral rather than its vertical mode. The structure is compatible with conventional CMOS and NMOS processing techniques.

1 Claim, 2 Drawing Figures

INTEGRATED CIRCUITS

This invention relates to integrated circuits and in particular to circuits incorporating both bipolar and field effect devices on a common semiconductor chip. The invention also relates to a lateral bipolar transistor structure that is compatible with field effect processing techniques.

Conventional integrated circuits generally employ either field effect or bipolar devices depending on the intended application of the circuit. Field effect devices are used mainly in digital applications where their small size and high input impedance allows simple, very dense, circuitry to be achieved. Bipolar circuits on the other hand are used mainly in analogue applications such as radio and audio frequency signal processing or where high current output stages are necessary.

There is a need in certain applications, e.g. telephony, for the processing of both digital and analogue signals and this normally requires the provision of two separate chips with many interconnecting paths between them. Clearly it would be advantageous to provide both field effect and bipolar devices on a single chip. A number of techniques for fabricating field effect and bipolar devices on a single chip have been proposed but these techniques suffer from various disadvantages. In particular, if CMOS (Complementary Metal Oxide Silicon) processing is adapted for use with the standard bipolar buried collector processing, good bipolar performance is achieved but the CMOS packing density, speed and predictability are adversely affected.

The object of the present invention is to minimize or to overcome these disadvantages.

According to the invention there is provided a bipolar lateral npn transistor formed in a lightly doped p$^-$-type well contained in a lightly doped n$^-$-type well in a very lightly doped p$^{---}$-type substrate, the transistor including base collector and emitter regions, wherein the emitter comprises an n$^+$-type region formed by diffusion through the same window as a further, medium doped, p-type base diffusion, wherein the base diffusion forms a narrow p-type layer between the n$^+$ emitter the p$^-$ well material such that lateral extension of the base side of the collector/base depletion region is restricted thereby providing a narrow lateral base width and ensuring that the transistor, in use, acts predominantly in a lateral mode.

The use of a lateral bipolar transistor structure overcomes the high cost, low yield, process step of growing epitaxial material on the highly doped buried layers required for low collector resistance in the standard buried collector processes.

Figure 2:
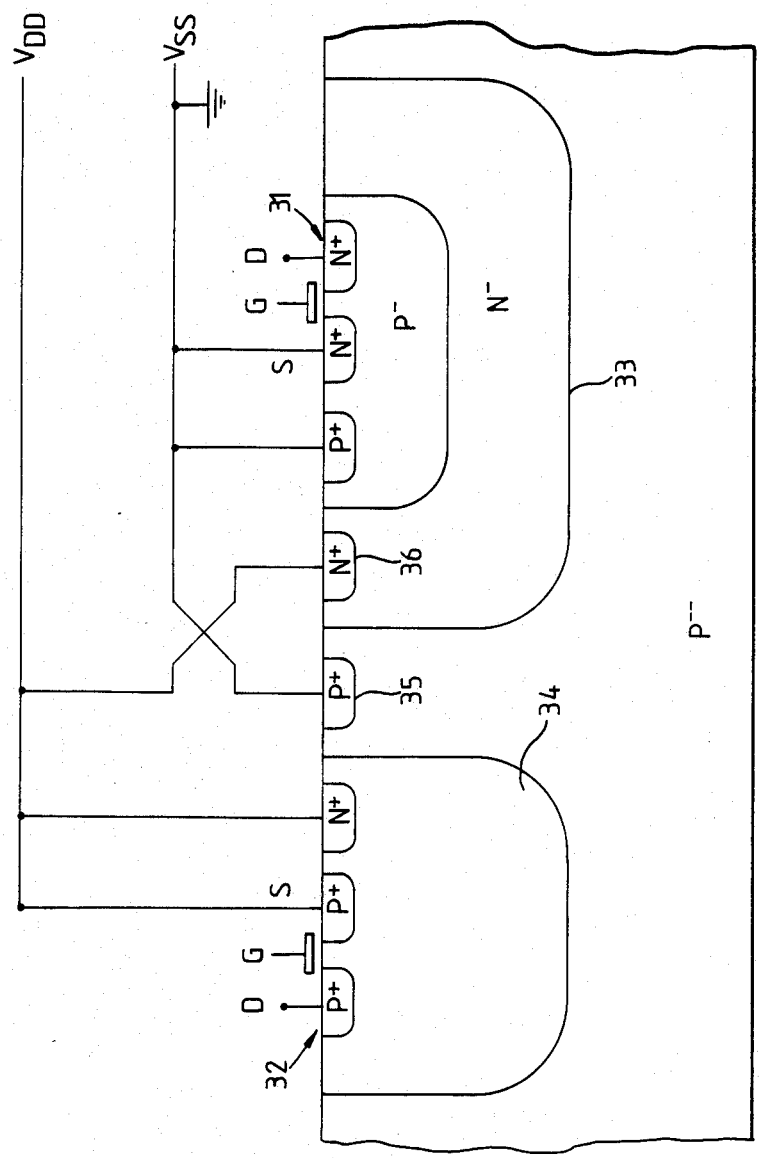

An embodiment of the invention will now be described with reference to the accompanying drawings in which:

FIG. 1 is a cross-sectional view of a bipolar transistor structure compatible with MOS processing techniques, and FIG. 2 is a cross sectional view of a complementary MOS transistor structure suitable for co-fabrication with the bipolar transistor of FIG. 1.

Referring to FIG. 1, the npn lateral transistor structure is formed in a very lightly doped p$^{---}$-type silicon substrate 11. A lightly doped n$^-$-type well 12 is deeply diffused into the substrate 11 and a further lightly doped p$^-$-type well 13 is diffused into the well 12. A p-type region 14 is diffused to form the intrinsic base, together with a p$^+$-type region 15 to act as a base contact. N$^+$ regions are added for the emitter 16 and collector contact region 17, during which the emitter is diffused through the same window as the base 14, to end up with a narrow P region surrounding and self aligned to the emitter. The region 17 provides a collector for lateral transistor action and a collector contact for vertical transistor action. This region 17 is disposed across the boundary between the p$^-$-type well 13 and the n$^-$-type well 12. The exact position of the collector region is not critical and it is therefore not necessary to provide excessively fine masking tolerance.

The approximate boundary of the base-collector depletion region is indicated by the dashed lines 21 and 22. As can be seen the inner edge of this depletion region approximately follows the pn junction boundary 18 of the p$^-$-type and n$^-$-type wells 13 and 12 respectively and terminates at the semiconductor surface between the emitter 16 and collector region 17 and immediately adjacent the p-type region surrounding the emitter. The boundary is distorted below the region beneath the emitter and collector contact regions such that the non-depleted region of the P-base 13 is wide below the emitter but very narrow at the surface. This defines a narrow active base region in the lateral emitter-collector path thus ensuring that the transistor structure operates predominantly in its lateral rather than its vertical mode. The structure is self aligning thus facilitating processing of the device.

Since the transistor structure is formed in an n$^-$-type well in a p$^{---}$-type substrate it is compatible with current NMOS or CMOS processing wherein the individual devices are disposed in and isolated by N or P type wells in an opposite polarity substrate. Such a construction, compatible with the bipolar transistor structure of FIG. 1 is shown in FIG. 2. The arrangement shown comprises an n-channel (31) and p-channel (32) device each disposed in its respective n$^-$-type well 33 and 34. It will however be clear that devices of only one polarity, e.g. NMOS transistors, may be employed. In such a case, and where latch-up is not a problem, the n-channel transistor n$^-$-type well 33 is also not required. The p$^+$-type and n$^+$-type regions that form the drain and source regions of the two transistors may be formed simultaneously with the corresponding polarity zones of the bipolar transistors that are fabricated on the same chip. Advantageously a further p$^+$-type region 35 may be provided between the two complementary transistors 31 and 32 which zone is connected to the V$_{ss}$ supply of the circuit. A similar n$^+$-type region 36 in the n-channel transistor well is coupled to the V$_{DD}$ supply. This reverse biassing of nested well junctions reduces the risk of latch-up of the CMOS portion of the circuitry caused by parasitic bipolar transistor action.

I claim:

1. An MOS compatible bipolar transistor structure comprising an npn lateral high gain transistor and an npn vertical low gain transistor formed in a lightly doped n$^-$-type well in a major surface of a very lightly doped p$^{---}$-type substrate, the structure comprising a lightly doped p$^-$-type well found in the n$^-$-type well, a p$^+$-region and p-type region formed in the p$^-$-type well, a first n$^+$-type region formed in said p-type region, and a second n$^+$-type region formed at the surface boundary between the p$^-$-type well and the n$^-$-type well, wherein said first n$^+$-type region provides a common emitter of both said transistors, wherein said second n$^+$-type region provides the collector of the lateral transistor and a collector contact of the vertical transistor, wherein said p+-type region provides a base contact of both said transistors, wherein said p-type region provides the base of the lateral transistor and, together with the p⁻-type well, the base of the vertical transistor, and wherein a depletion region is disposed across the boundary between the p⁻-type and n⁻-type wells, the boundary being narrow adjacent the lateral transistor base so as to provide a high lateral gain and wide adjacent the vertical transistor base so as to provide a low vertical gain, whereby the structure, in use, acts predominantly in a lateral mode.

* * * * *